(12) United States Patent
Yu et al.

(10) Patent No.: US 6,746,727 B1
(45) Date of Patent: *Jun. 8, 2004

(54) METAL TO ILD ADHESION IMPROVEMENT BY REACTIVE SPUTTERING

(75) Inventors: Jick Yu, Beaverton, OR (US); Chi Hing Choi, Portland, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,286

(22) Filed: Aug. 24, 1998

(51) Int. Cl.$^7$ .............................. H05H 1/24; B05D 3/04; C23C 14/34

(52) U.S. Cl. .................. 427/579; 427/307; 204/192.15; 204/192.32

(58) Field of Search ........................ 204/192.22, 192.23, 204/192.35, 192.37, 192.15, 192.32; 427/307, 579

(56) References Cited

U.S. PATENT DOCUMENTS

| | | | | | |
|---|---|---|---|---|---|
| 5,232,571 | A | * | 8/1993 | Braymen ............... | 204/192.22 |
| 5,334,554 | A | * | 8/1994 | Lin et al. ..................... | 437/231 |
| 5,520,785 | A | * | 5/1996 | Evans et al. ........... | 204/192.27 |
| 5,886,410 | A | * | 3/1999 | Chiang et al. .............. | 257/759 |
| 6,211,065 | B1 | * | 4/2001 | Xi et al. ..................... | 438/627 |
| 6,323,119 | B1 | * | 11/2001 | Xi et al. ..................... | 438/627 |
| 6,624,064 | B1 | * | 9/2003 | Sahin et al. ................ | 438/627 |

* cited by examiner

*Primary Examiner*—Steven H. VerSteeg
(74) *Attorney, Agent, or Firm*—Blakely, Sokoloff, Taylor & Zafman LLP

(57) ABSTRACT

A method is described involving depositing a dielectric layer. The surface of the dielectric layer is modified to prevent outdiffusion from the dielectric layer. A metal layer is deposited above the modified surface of the dielectric layer.

10 Claims, 3 Drawing Sheets

METAL TO ILD ADHESION IMPROVEMENT BY REACTIVE SPUTTERING

BACKGROUND OF THE INVENTION

1. Field of the Invention

This invention relates to the field of semiconductor processing and more specifically to a method for improving metal to interlayer dielectric (ILD) adhesion.

2. Background Information

The semiconductor industry is always pushing and striving to develop faster and faster semiconductor devices. One way that has been determined to increase the speed of semiconductor devices is to fabricate those devices with dielectric materials having low dielectric constants, i.e. low-k dielectric materials. The use of low-k dielectric materials have lead to a host of new problems that now must be dealt with in order to produce reliable devices.

One such problem is metal delamination from the low-k dielectric underlayer. As illustrated in FIG. 1, delamination occurs when the metal layer 120 and interlayer dielectric (ILD) 110 begin to "pull away" from one another creating a gap 190. Metal delamination could potentially cause reliability problems and even cause device failure. Metal delamination tends to occur frequently when the metal-to-dielectric interface are subjected to high temperatures, for example temperatures of approximately 400° C. or greater. Temperatures greater than 400° C. are often reached during the various fabrication processes of a semiconductor device and thus could cause delamination between the metal layer and dielectric layers.

Other potential causes for delamination are contamination on the ILD surface and diffusion of dopants from the ILD. Contamination on the ILD surface degrades the metal to ILD adhesion because the contaminants block the metal from actually contacting the ILD surface in the areas that the contamination exists. If an ILD is a doped ILD, the dopants may diffuse from the ILD into the metal layer. The diffusion of the dopants tends to break down the adhesion between the metal and ILD at the metal to ILD interface.

One method to aid in the prevention of delamination is the use of an adhesion layer between the dielectric layer and the metal layer. FIG. 2a illustrates a dielectric layer 210 having an adhesion layer 230 deposited thereon. After the adhesion layer 230 is deposited on metal layer 220 is then deposited above the adhesion layer 230, as is illustrated in FIG. 2b.

One problem with adhesion layers is that they add processing steps to the manufacturing process. Any time processing steps and materials are added to a manufacturing process the cost, the time to complete the process, the potential for contamination, and the potential for errors all increase. Additionally, different metal and/or dielectric materials would require different adhesion materials. In other words, depending upon the type of metal layer to be formed above the dielectric layer different adhesion layers would probably have to be used. For example, the adhesion layer used for a tungsten metal layer would likely be different from the adhesion layer used for a copper metal layer or an aluminum metal layer.

Another method to aid in the prevention of delamination is the treatment of the dielectric layer with an argon plasma prior to the deposition of the metal layer. The argon plasma is used to remove the contaminants from the dielectric surface. The presence of contaminants on the dielectric surface tends to degrade the adhesion between the metal layer and the dielectric layer.

FIG. 3a illustrates a dielectric layer 310 being treated with an argon plasma 350. The argon plasma removes contaminants from the dielectric surface 310. Metal layer 320 is then deposited above dielectric layer 310, as is illustrated in FIG. 3b. Although contamination is reduced between the metal layer 320 and dielectric layer 310, the use of the argon plasma 350 does not help to prevent delamination caused by the diffusion of dopants from the dielectric layer 310. The diffusion of dopants from dielectric layer 310 degrades the adhesion at the metal layer 320 and dielectric layer 310 interface. Thus, delamination may still occur and metal layer 320 may lift from the underlying dielectric layer 310 forming gap 390, as is illustrated in FIG. 3c.

What is needed is a method to improve the dielectric to metal adhesion such that delamination will not occur and gaps are not formed.

SUMMARY OF THE INVENTION

The present invention is a method to improve metal to dielectric adhesion. A dielectric layer is deposited, then a surface of the dielectric layer is modified to improve adhesion from the dielectric layer. A metal layer is then deposited above the modified surface of the dielectric layer.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 3b illustrates a metal layer formed on top of the argon treated dielectric layer of FIG. 3a.

FIG. 4b illustrates the modified surface of the dielectric layer of FIG. 4a.

DETAILED DESCRIPTION

A metal to ILD adhesion improvement by reactive sputtering is disclosed. In the following description, numerous specific details are set forth such as specific materials, processes, parameters, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention is a method to improve metal to interlayer dielectric adhesion. Improved metal to interlayer dielectric adhesion decreases the occurrence of delamination of the metal layer from the underlying dielectric layer surface.

Delamination has many causes. One such cause is the outdiffusion or outgassing that is prevalent in some dielectric materials. For example, fluorine outdiffusion from the dielectric material SiOF and water (or moisture from the air) absorbtion to BPSG can cause the metal layer to peel away from the underlying dielectric material.

Another cause of delamination is contamination or particles on the surface of the dielectric layer. The contamination does not allow a metal layer to adhere to the bare surface of the dielectric material. Thus, the metal layer may peel away from the dielectric layer in the regions where the surface contamination exists. This may in turn cause the metal layer to peel away from the dielectric layer in other areas adjacent the contaminated surface.

Yet another cause of delamination is high temperatures which may be reached during fabrication of the semiconductor device during processing steps subsequent to the formation of the metal to interlayer dielectric interface. High temperatures, for example temperatures of 400° C. or greater, may also cause delamination. Such high temperatures may decrease the adhesiveness at the metal-to-dielectric interface and thereby cause delamination.

Figure 1:
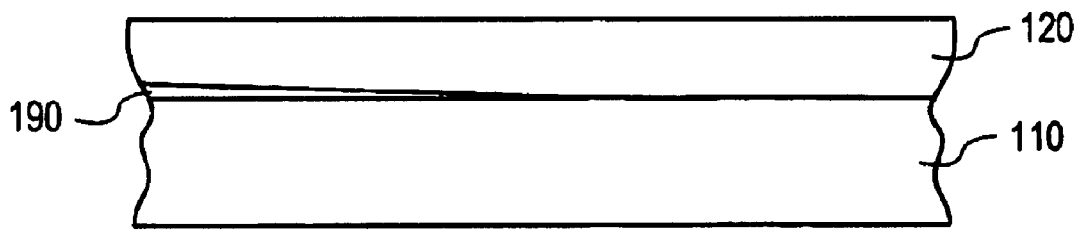
FIG. 1 illustrates delamination of a metal layer from an underlying dielectric layer.
Figure 2A:
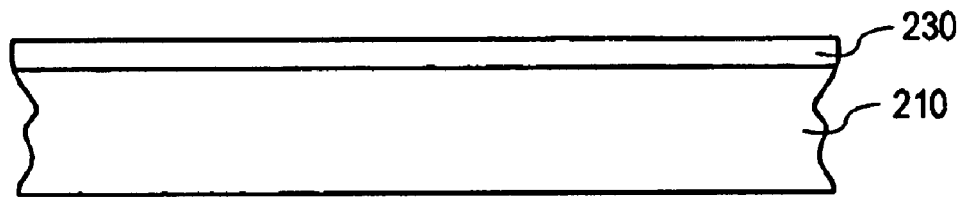
FIG. 2a illustrates a dielectric layer having an adhesion layer deposited thereon.
Figure 2B:
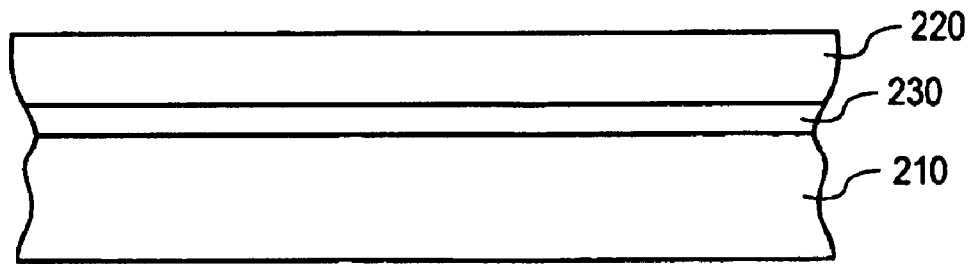
FIG. 2b illustrates the structure of FIG. 2a having a metal layer deposited above the adhesion layer.
Figure 3A:
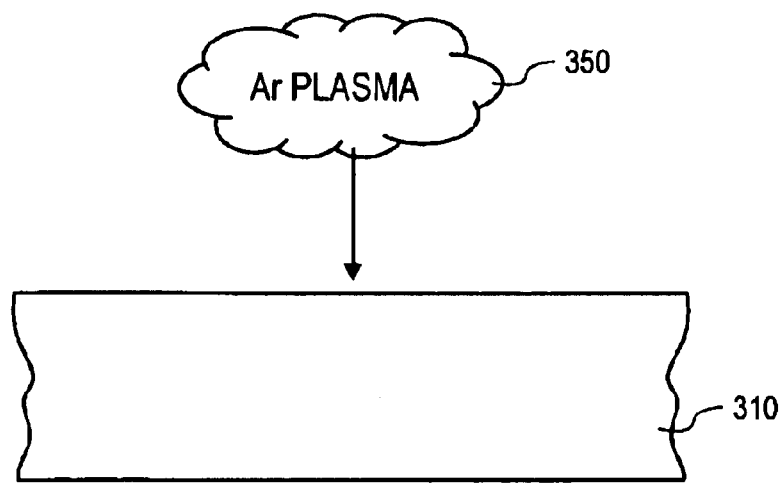
FIG. 3a illustrates a dielectric layer being treated with an argon plasma.
Figure 3B:
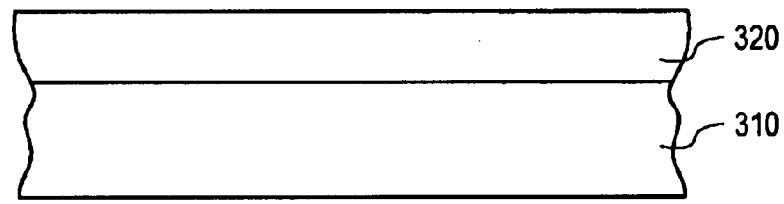
Figure 3C:
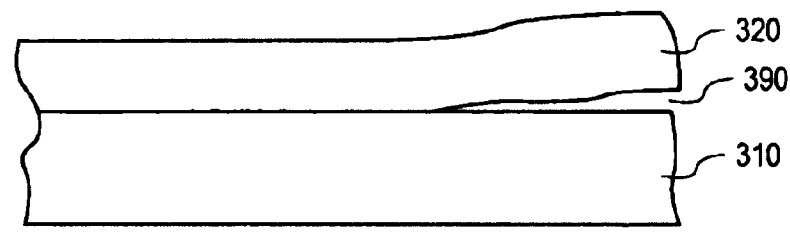
FIG. 3c illustrates the metal layer lifting from the underlying dielectric layer.
Figure 4A:
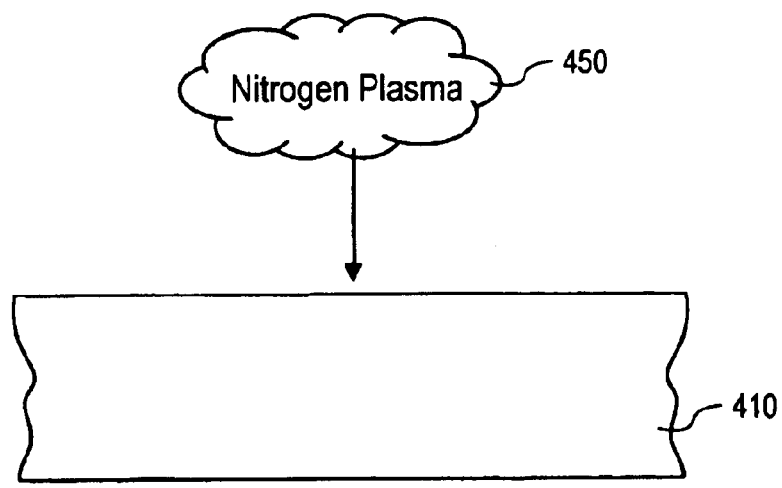
FIG. 4a illustrates a dielectric layer being modified according to one embodiment of the present invention.

The present invention is a process for improving the adhesion between the dielectric layer and the metal layer by reactive sputtering the interlayer dielectric just before metal deposition. In one embodiment the interlayer dielectric is reactive sputtered using a nitrogen plasma. FIG. 4a illustrates a dielectric layer 410 being reactively sputtered in a nitrogen plasma 450.

Figure 4B:
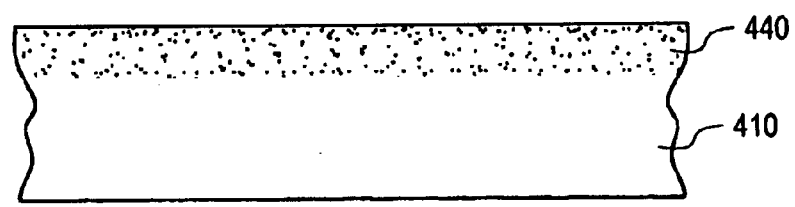

Reactive sputtering the interlayer dielectric 410 with a nitrogen plasma 450 modifies the properties of a thin layer of the top portion of the interlayer dielectric in a way that the metal can adhere to the interlayer dielectric. FIG. 4b illustrates the modified surface 440 of the dielectric layer 410 after reactive sputtering with the nitrogen plasma 450.

It should be noted that the duration of the plasma treatment is proportional to the improvement of the adhesion of the metal layer to the interlayer dielectric. In other words, the longer the duration of the plasma treatment the better the adhesion of the metal film to the dielectric film. It should also be noted that the longer the duration of the plasma treatment the greater the modification of the dielectric layer. Thus, the longer the plasma treatment step the thicker the modified surface 440 becomes.

Figure 4C:
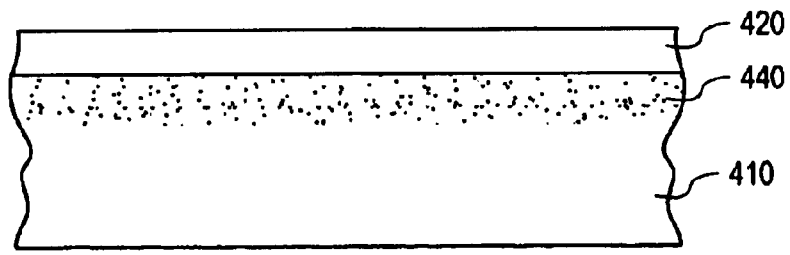
FIG. 4c illustrates a metal layer having been deposited on top of the modified surface of the dielectric layer of FIG. 4b.

After the surface of the dielectric layer is modified the metal layer is then deposited. It should be noted that the metal layer may be made up of any metal or metal alloy used in the fabrication of semiconductor devices. For example, the metal layer may be titanium, titanium nitride, aluminum, aluminum-copper, aluminum alloys, or any combination thereof. FIG. 4c illustrates a metal layer 420 having been deposited on top of the modified surface 440 of the dielectric layer 410. In one embodiment of the present invention the plasma treatment step is performed in the same chamber as the metal deposition step such that once the dielectric layer is modified, the modified surface will not be exposed to an uncontrolled atmosphere.

The modified top layer of the interlayer dielectric also helps prevent outdiffusion and outgassing from the dielectric material. The modified surface 440 blocks more active species from diffusing and/or outgassing from the bulk of the interlayer dielectric 410 to the interlayer dielectric-to-metal interface. Thus, the modified surface 440 acts as a diffusion barrier such that more active species within the dielectric material are unable to diffuse into the metal layer 420 and degrade the adhesion between the metal layer 420 and interlayer dielectric 410.

Another benefit of the present invention is that reactive sputtering dielectric layer 410 with the nitrogen plasma removes contamination from the surface of the dielectric layer 410. If not removed the contamination could potentially cause delamination. Thus, by removing the surface contamination the present invention helps to prevent yet another potential cause of delamination.

Yet another benefit of the present invention is that the modified surface 440 may be formed in a graded fashion. By forming the modified surface in a graded fashion a separate layer is not formed, thus making the modified surface 440 mechanically strong. FIG. 4b illustrates a modified surface 440 formed in a graded fashion. As illustrated in FIG. 4b, a greater portion of the top of the dielectric layer 410 is modified while the amount of modification "fades" or "tapers off" the deeper into the dielectric layer 410. The grading of the modified surface makes the modified surface 440-to-dielectric layer interface mechanically strong such that the modified surface 440 is incorporated into the dielectric layer 410. Therefore, the modified surface 440 will not have the tendency to peel away from the interlayer dielectric 410 the way most prior art adhesion layers tend to do.

In one embodiment the present invention was used to treat an interlayer dielectric of silicon oxy-fluoride (SiOF). After the SiOF layer was deposited the present invention was used to treat the SiOF layer with a nitrogen plasma. Treating the SiOF layer with a nitrogen plasma created a silicon oxynitride interface in the upper portion of the SiOF layer. The silicon oxynitride interface then acts as a diffusion barrier and stops the diffusion of fluorine from the SiOF layer into the metal layer.

The silicon oxynitride interface is also graded such that a separate silicon oxynitride layer is not formed, but rather a portion of the SiOF layer has been modified to become a silicon oxynitride interface. In other words, a greater portion of the top of the SiOF layer is modified into a silicon oxynitride. The amount of silicon oxynitride "fades" or "tapers off" deeper into the SiOF layer. The grading of the silicon oxynitride interface makes the interface mechanically strong such that the silicon oxynitride is still incorporated into the SiOF layer and will not peel away from the interlayer dielectric the way most prior art adhesion layers tend to do under high temperatures.

The present invention may be used in conjunction with any interlayer dielectric that contains active species that have the potential to diffuse toward the metal-to-interlayer dielectric interface and/or any interlayer dielectric that exhibits outgassing. Some examples of interlayer dielectrics that may benefit from the use of the present invention are borophosphosilicate glass (BPSG), silicon oxy-fluoride (SiOF), fluorocarbon (CFx, wherein x is a variable) etc. Low k dielectric materials, in particular, (i.e. dielectric materials having a dielectric constant on the order of k=1–4) benefit from the present invention.

It should be noted that there are many tools which may used to practice the present invention. In one embodiment of the present invention an Endura 5000 available from Applied Materials Incorporated in Santa Clara, Calif. is used. Other tools, for example, from Gasonics and Varian, and any other tool capable of generating plasma may also be used.

The present invention is a method for reactive sputtering a dielectric layer with a nitrogen plasma in order to modify the surface of the dielectric layer. The modified surface of the dielectric layer helps to prevent outdiffusion and outgassing from the dielectric material. Also, since the surface of the dielectric layer is modified, a new layer is not created and thus there is no new layer which could peel away. Additionally, since the surface of the dielectric layer is modified the modified surface can be formed in a graded fashion such that the top surface is greatly modified while the modification tapers off the deeper the dielectric layer is affected thereby making the modified surface mechanically strong. Furthermore, reactive sputtering with a nitrogen plasma removes particles and contaminants from the surface of the dielectric layer which could also lead to delamination.

Thus, a metal to ILD adhesion improvement by reactive sputtering has been described. Although specific embodiments, including specific parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method comprising:

depositing a dielectric layer;

improving the metal-to-dielectric adhesion of a surface of said dielectric layer by treating the surface with a nitrogen plasma; and depositing a metal layer directly on the surface that was treated with the nitrogen plasma, wherein the treating and the depositing are conducted in a same chamber.

2. The method as described in claim 1 wherein said dielectric layer comprises any dielectric layer that exhibits outgassing.

3. The method as described in claim 1 wherein said dielectric layer comprises a low k dielectric material.

4. The method as described in claim 1 wherein said dielectric layer comprises SiOF.

5. The method as described in claim 4 wherein modifying said surface of said dielectric layer creates a silicon-oxy-nitride interface between said dielectric layer and said metal layer.

6. The method as described in claim 1 wherein said dielectric layer comprises BPSG.

7. The method as described in claim 1, wherein after deposition of said metal layer, a processing operation of greater than 400° C. is performed on the metal to dielectric interface.

8. The method as described in claim 1 wherein said metal layer is selected from the group consisting of: titanium, titanium nitride, aluminum, aluminum-copper, aluminum alloys, and any combination thereof.

9. The method as described in claim 1 wherein the surface of said dielectric layer comprises at least one of surface contamination and particles prior to treating with nitrogen plasma.

10. The method as described in claim 1 wherein treating is conducted in a graded fashion such that the treatment is greatest near the surface and tapers off over at least a portion of the thickness of said dielectric layer.

* * * * *